United States Patent
Chang et al.

(10) Patent No.: US 7,056,787 B2
(45) Date of Patent: Jun. 6, 2006

(54) METHOD OF MANUFACTURING SEMICONDUCTOR DEVICE

(75) Inventors: Ko-Hsing Chang, Hsinchu (TW); Chiu-Tsung Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/905,610

(22) Filed: Jan. 12, 2005

(65) Prior Publication Data
US 2005/0233519 A1    Oct. 20, 2005

(30) Foreign Application Priority Data
Apr. 20, 2004    (TW) ................ 93110944 A

(51) Int. Cl.
*H01L 21/8242* (2006.01)
*H01L 21/20* (2006.01)
*H01L 21/4763* (2006.01)

(52) U.S. Cl. ............. 438/253; 438/239; 438/618; 438/387

(58) Field of Classification Search ........... 438/239, 438/637, 398, 618, 253, 240, 387, 622, 644
See application file for complete search history.

(56) References Cited

U.S. PATENT DOCUMENTS

| | | | |
|---|---|---|---|
| 6,025,226 A | 2/2000 | Gambino et al. | 438/244 |
| 6,649,464 B1 | 11/2003 | Lee | 438/238 |
| 6,784,552 B1 * | 8/2004 | Nulty et al. | 257/774 |
| 6,838,352 B1 * | 1/2005 | Zhao | 438/386 |
| 6,841,844 B1 * | 1/2005 | Hsu et al. | 257/522 |
| 6,867,094 B1 * | 3/2005 | Park | 438/253 |
| 6,930,038 B1 * | 8/2005 | Lin et al. | 438/633 |
| 6,953,745 B1 * | 10/2005 | Ahn et al. | 438/637 |

* cited by examiner

*Primary Examiner*—Chuong Anh Luu
(74) *Attorney, Agent, or Firm*—Jianq Chyun IP Office

(57) ABSTRACT

A method of manufacturing a semiconductor device. The method comprises steps of providing a substrate having a first metal layer and a second metal layer formed thereon. A first dielectric layer, an etching stop layer having a first opening located above the first metal layer and a second opening located above the second metal layer and a second dielectric layer are formed sequentially. A portion of the first dielectric layer and a portion of the second dielectric layer are removed to form a first trench exposing the first metal layer. A capacitor dielectric layer is formed over the substrate. A third opening is formed in the capacitor dielectric layer. A portion of the second dielectric layer and a portion of the first dielectric layer exposed by the third opening are removed to form an opening. A metal layer is formed to fill out the first trench and the opening.

20 Claims, 6 Drawing Sheets

METHOD OF MANUFACTURING SEMICONDUCTOR DEVICE

CROSS-REFERENCE TO RELATED APPLICATION

This application claims the priority benefit of Taiwan application serial no. 93110944, filed on Apr. 20, 2004.

BACKGROUND OF THE INVENTION

1. Field of Invention

The present invention relates to a method of manufacturing a semiconductor device. More particularly, the present invention relates to a method of manufacturing a semiconductor device for simultaneously forming a dual metal damascene structure and a metal-insulator-metal capacitor.

2. Description of Related Art

With the increase of the integration of the semiconductor device, in the deep sub-micron process, the size of the device is reduced and the space for forming the capacitor is decreased as well. The capacitance of a capacitor depends on the surface area of the upper electrode and the lower electrode. Currently, the way to increase the capacitance of the capacitor with the decrease of the size of the capacitor includes selecting a dielectric layer having relatively high capacitance and increasing the surface area of the lower electrode of the capacitor.

When the material having relatively high dielectric constant is used in the process of manufacturing the capacitor to overcome the problem mentioned above, the material used to form the upper and the lower electrodes is changed as well to highlight the performance of the capacitor. Notably, because of the low interfacial reaction of the metal-insulator-metal (MIM) structure capable of improving the performance of the capacitor, the MIM structure is widely commercially used in industry.

Additionally, as the line width being decreased to deep sub-micron, the copper is used to form inner connects. However, it is not easy to etch copper. Hence, metal damascene process is used to replace the conventional method for manufacturing the copper wire structure. Recently, several manufacturing process about forming the MIM capacitor and the metal damascene structure are disclosed, such as those shown in U.S. Pat. No. 6,025,226 and U.S. Pat. No. 6,649,464.

FIG. 1A through FIG. 1B are cross-sectional views showing the conventional method (disclosed in U.S. Pat. No. 6,025,226) for manufacturing a semiconductor device having a capacitor and a metal damascene structure.

As shown in FIG. 1A, a substrate 105 having a metal layer 110 and a metal layer 115 formed thereon is provided. A dielectric layer 107 is formed on the substrate 105. An opening 120 and a via hole 130 are formed in the dielectric layer 107. A conformal insulator layer 122 is formed over the substrate 105.

As shown in FIG. 1B, the insulator layer 122 and the dielectric layer 107 are patterned to form a trench 132 over the via hole 130. A metal layer 124 is formed to fill the via hole 130 and the trench 132 to form a dual damascene structure and a metal layer 126 is formed to fill the opening 120. The metal layer 126, the insulator layer 122 and the metal layer 110 together form an MIM capacitor.

In the process mention above, since the insulator layer 122 is also formed in the via hole 130, the size of the via hole 130 is decreased. Therefore, the aspect ratio of the via hole 130 is increased. When the aspect ration of the via hole 130 is increased, it is difficult to fill out the via hole 130 with metal and it is easy to form carven in the via hole 130 during filling the via hole 130 with metal. Therefore, the leakage of the metal wires will happen easily and the performance of the device is decreased.

FIG. 2A through FIG. 2C are cross-sectional views showing the conventional method (disclosed in U.S. Pat. No. 6,649,464) for manufacturing a semiconductor device having a capacitor and a metal damascene structure.

As shown in FIG. 2A, a substrate 200 having a barrier layer 204, a metal layer 214, a barrier layer 202 and a metal layer 212 formed thereon is provided. A sealing layer 210 is formed over the substrate 200. A dielectric layer 220 having an opening 230 exposing the metal layer 212 is formed over the substrate 200. A dielectric layer 222 is formed over the substrate 200. Further, a barrier layer 232 and a metal layer 242 is formed in the opening 230. A sealing layer 240 is formed over the substrate 200. The metal layer 212, the dielectric layer 222 and the metal layer 242 together form an MIM capacitor.

As shown in FIG. 2B, an via hole 260 is formed in the dielectric layer 220 and the sealing layer to expose the metal layer 214. A barrier layer 234 and a metal layer 244 are formed in the via hole 260. A sealing layer 270 is formed over the substrate 200.

As shown in FIG. 2C, after a dielectric layer 280 is formed over the substrate 200, a trench 274 and an opening 272 are formed in the dielectric layer 280. A barrier layer 254 and a metal layer 264 are formed in the trench 274 and a barrier layer 242 and a metal layer 262 are formed in the opening 272. The metal layer 264 and the metal layer 234 together form a dual metal damascene structure.

In the process mentioned above, the dual metal damascene is formed after the MIM capacitor is formed. Because it is necessary to perform several times of metal deposition process, chemical mechanical polishing process and photolithography process, the cost of the manufacturing process is increased.

SUMMARY OF THE INVENTION

Accordingly, at least one objective of the present invention is to provide a method of manufacturing a semiconductor device, wherein a metal-insulator-metal capacitor can be formed by using metal damascene process so as to decrease the steps of manufacturing process and to reduce the cost of the manufacturing process.

The present invention provides a method of manufacturing a semiconductor device for simultaneously forming a wire structure and a capacitor. The method comprises steps of providing a substrate having a first conductive layer and a second conductive layer formed thereon. A first dielectric layer is formed over the substrate. An etching stop layer is formed on the first dielectric layer. The etching stop layer is patterned to form a first opening located above the first conductive layer and a second opening located above the second conductive layer. A second dielectric layer is formed over the substrate. A portion of the second dielectric layer and the first dielectric layer is removed to form a first trench exposing the first conductive layer. A capacitor dielectric layer is formed over the substrate. A patterned mask layer is formed on the capacitor dielectric layer, wherein the patterned mask layer possesses a third opening located above the second conductive layer. A portion of the capacitor dielectric layer, a portion of the second dielectric layer and a portion of the first dielectric layer exposed by the third opening are removed to form a fourth opening exposing the second conductive layer. The patterned mask layer is removed. A third conductive layer is formed over the substrate. A portion of the third conductive layer is removed, wherein the portion of the third conductive layer is not located in the first trench and the fourth opening.

Because the metal deposition process is only performed once when the MIM capacitor and the dual metal damascene structure are formed simultaneously. Hence, the steps of manufacturing process can be decreased so that the cost of the manufacturing process is reduced. Moreover, during the formation of the dual damascene opening, the etching stop layer is used as a self-align mask. Therefore, the trench and the via hole can be formed by performing the etching process one time. Further, no capacitor dielectric layer is formed in the via hole so as to prevent the size of the via hole from being minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
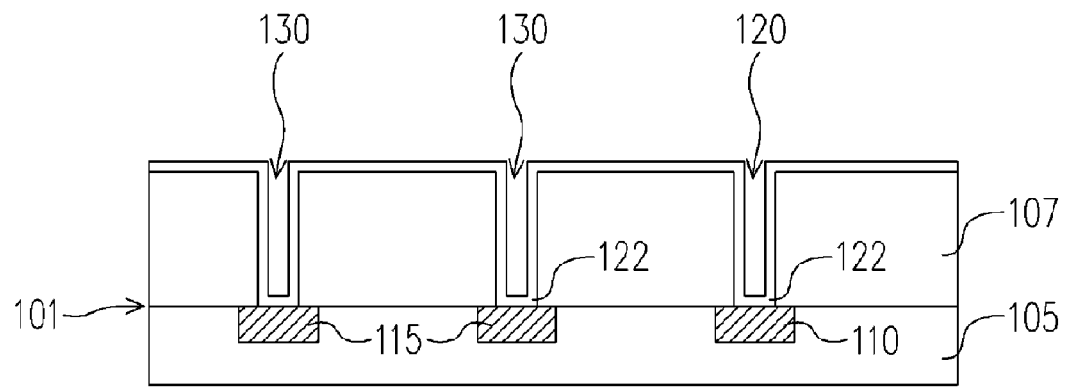
FIG. 1A through FIG. 1B are cross-sectional views showing the conventional method (disclosed in U.S. Pat. No. 6,025,226) for manufacturing a semiconductor device having a capacitor and a metal damascene structure.
Figure 1B:
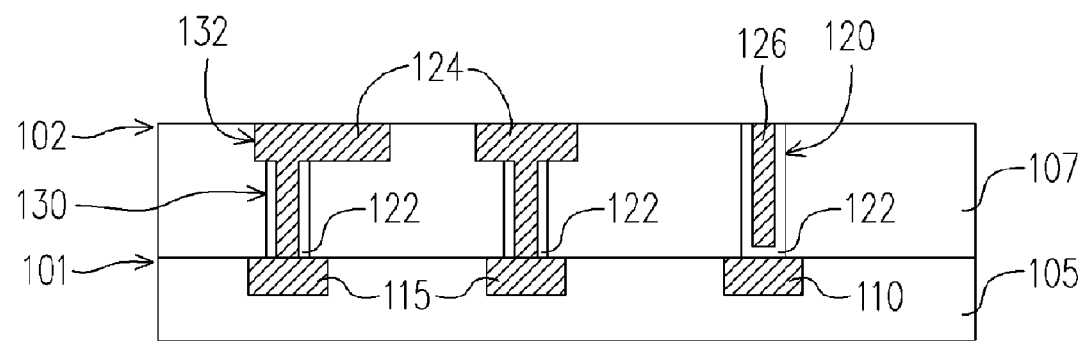
Figure 2A:
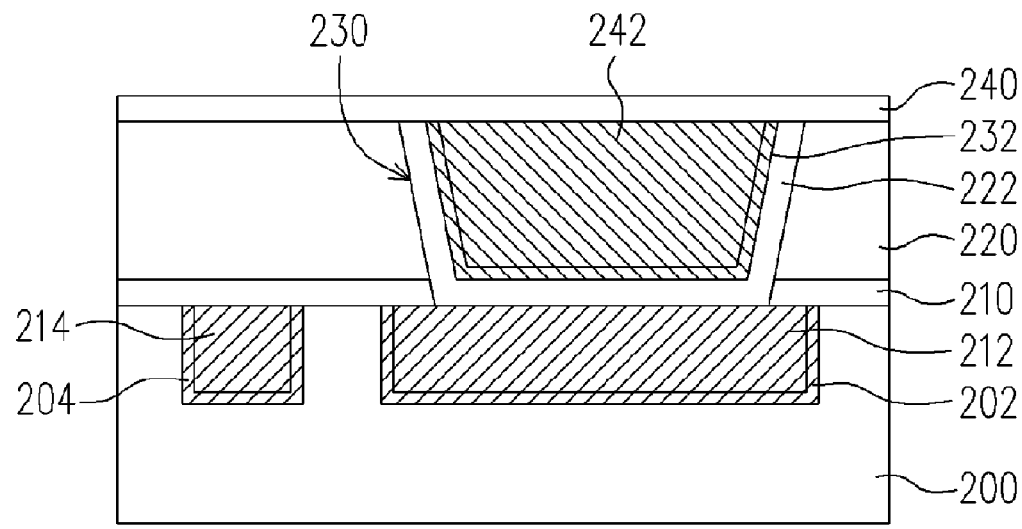
FIG. 2A through FIG. 2C are cross-sectional views showing the conventional method (disclosed in U.S. Pat. No. 6,649,464) for manufacturing a semiconductor device having a capacitor and a metal damascene structure.
Figure 2B:
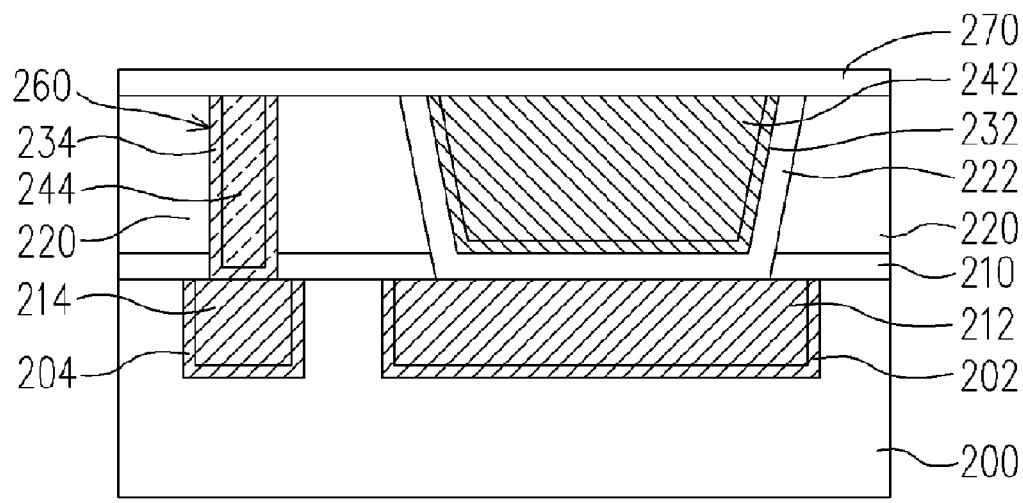
Figure 2C:
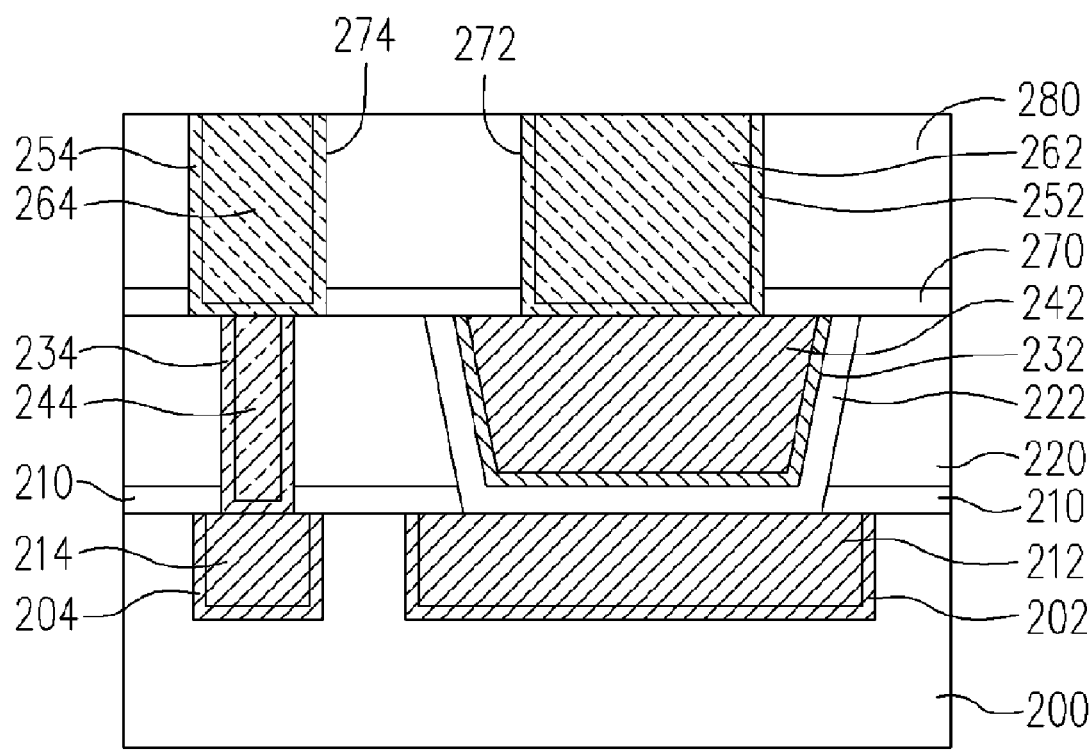

Reference will now be made in detail to the present preferred embodiments of the invention, examples of which are illustrated in the accompanying drawings. Wherever possible, the same reference numbers are used in the drawings and the description to refer to the same or like parts.

FIG. 3A through FIG. 3F are cross-sectional views showing a method of manufacturing a semiconductor device according to a preferred embodiment of the present invention.

Figure 3A:
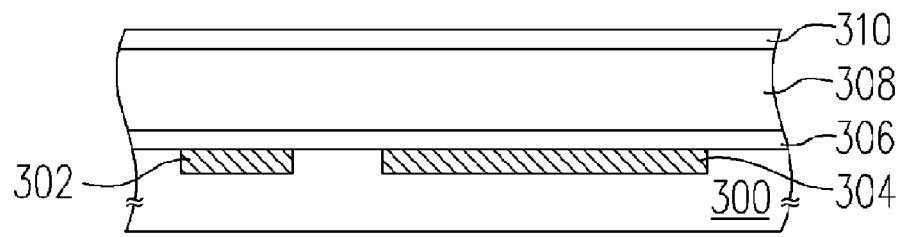
FIG. 3A through FIG. 3G are cross-sectional views showing a method of manufacturing a semiconductor device according to a preferred embodiment of the present invention.

As shown in FIG. 3A, a substrate 300 having a metal layer 302 and a metal layer 304 formed thereon is provided. The metal layer 302 and the metal layer 304 can be made of, for example, copper or aluminum.

A sealing layer 306 is formed over the substrate to cover the metal layer 302 and the metal layer 304. The sealing layer 306 can be made of, for example, silicon nitride or other proper nitride material or oxide material in order to prevent the surface of the metal layer 302 and the metal layer 304 from being oxidized. The method for forming the sealing layer 306 can be, for example, chemical vapor deposition (CVD). The formation of the sealing layer is optional. That is, when the metal layer 302 and the metal layer 304 are made of the material which is not easy is be oxidized, it is not necessary to form the sealing layer 306.

A dielectric layer 308 is formed on the sealing layer 306. The dielectric layer 308 can be made from, for example, silicon oxide by CVD. The dielectric layer 308 can be also made of, for example, the material with relatively low dielectric constant or other proper material and the method for forming the dielectric layer 308 is varied with the low dielectric constant material selected to form the dielectric layer 308. The method for forming the dielectric layer 308 can be, for example, spin coating.

An etching stop layer 310 is formed on the dielectric layer 308. The etching stop layer 310 can be made of, for example, the material, such as silicon nitride, having etching property different from that of the dielectric layer 308.

Figure 3B:
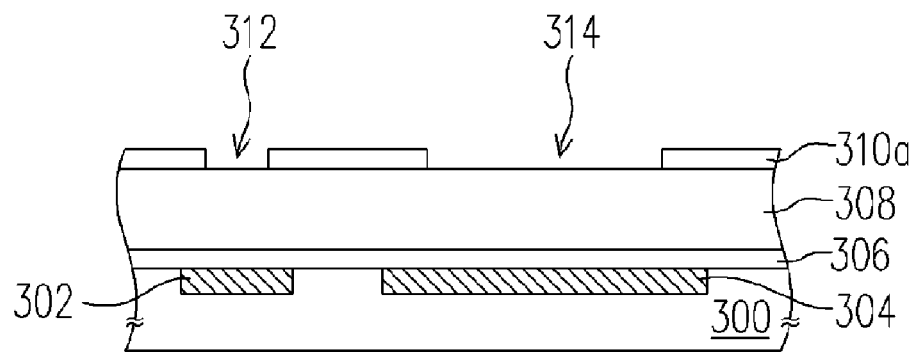

As shown in FIG. 3B, a patterned mask layer (not shown) is formed on the etching stop layer 310. The patterned mask layer can be, for example, a photoresist layer. By using patterned mask layer as a etching mask layer, a portion of the etching stop layer 310 exposed by the patterned mask layer is removed until a portion of the surface of the dielectric layer 308 is exposed to form a patterned etching stop layer 310a having an opening 312 located above the metal layer 302 and an opening 314 located above the metal layer 304. The patterned mask layer is removed.

Figure 3C:
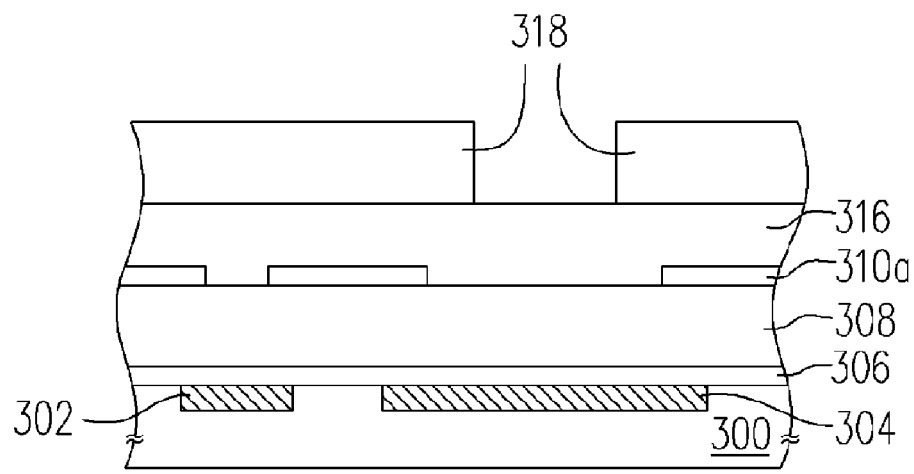

As shown in FIG. 3C, a dielectric layer 316 is formed over the substrate 300. The dielectric layer 316 can be formed from, for example, silicon oxide, by CVD. The dielectric layer 316 can be made of, for example, the material with relatively low dielectric constant or other proper material and the method for forming the dielectric layer 316 is varied with the low dielectric constant material selected to form the dielectric layer 316. The method for forming the dielectric layer 316 can be, for example, spin coating. A patterned photoresist layer 318 is formed on the dielectric layer 316.

Figure 3D:
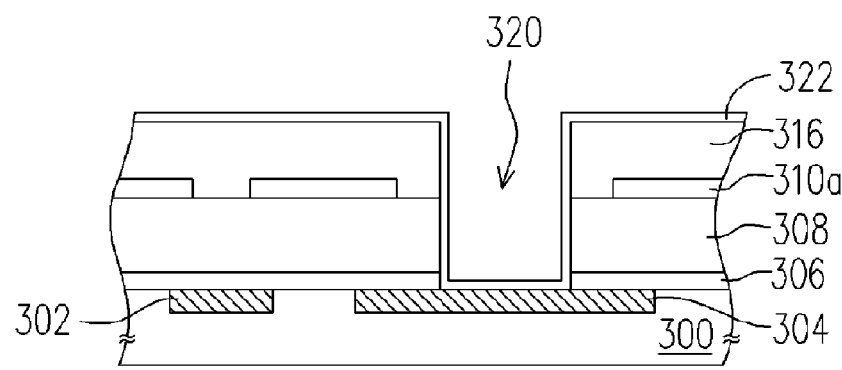

As shown in FIG. 3D, a portion of the dielectric layer 316, the dielectric layer 308 and the sealing layer exposed by the patterned photoresist layer 318 (as shown in FIG. 3C) is removed to form a trench 320 exposing the metal layer 304. A capacitor dielectric layer 322 is formed over the substrate 300. The capacitor dielectric layer 322 can be made from, for example, silicon nitride, silicon oxide, $Ta_2O_5$, $Ba_x Sr_{(1-x)} TiO_3$ or $BaTiO_3$ by CVD.

Figure 3E:
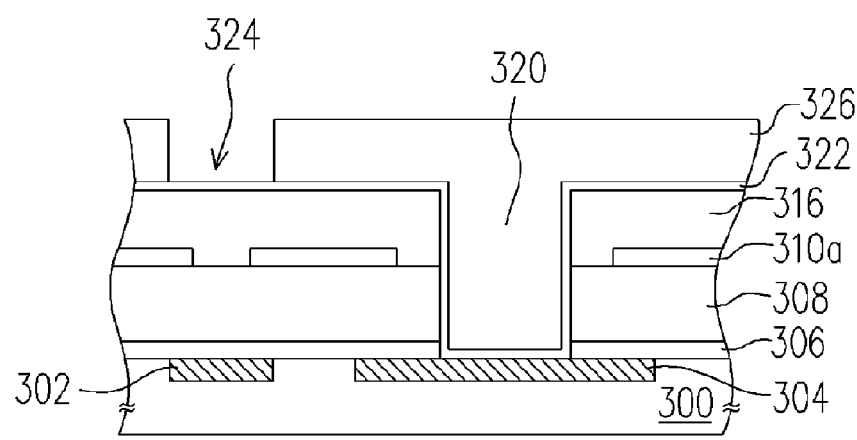

As shown in FIG. 3E, a patterned photoresist layer 326 having an opening 324 is formed on the capacitor dielectric layer 322, wherein the opening 324 is located above the metal layer 302.

Figure 3F:
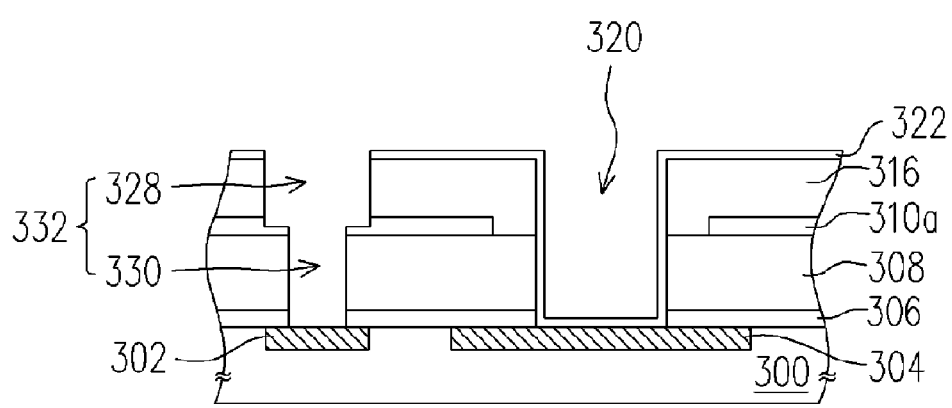

As shown in FIG. 3F, a portion of the capacitor dielectric layer 322 exposed by the opening 324 is removed. A portion of the dielectric layer 316, the dielectric layer 308 and the sealing layer 306 is removed to form an opening 332 exposing metal layer 302. The patterned photoresist layer 326 (as shown in FIG. 3E) is removed. The formation of the opening 332 further comprises a step of forming a trench 328 in the dielectric layer 316 and an opening 330 in the dielectric layer 308. The etching stop layer 310a is used as a self-aligned mask layer in the step of forming the opening 330 in the dielectric layer 308.

Figure 3G:
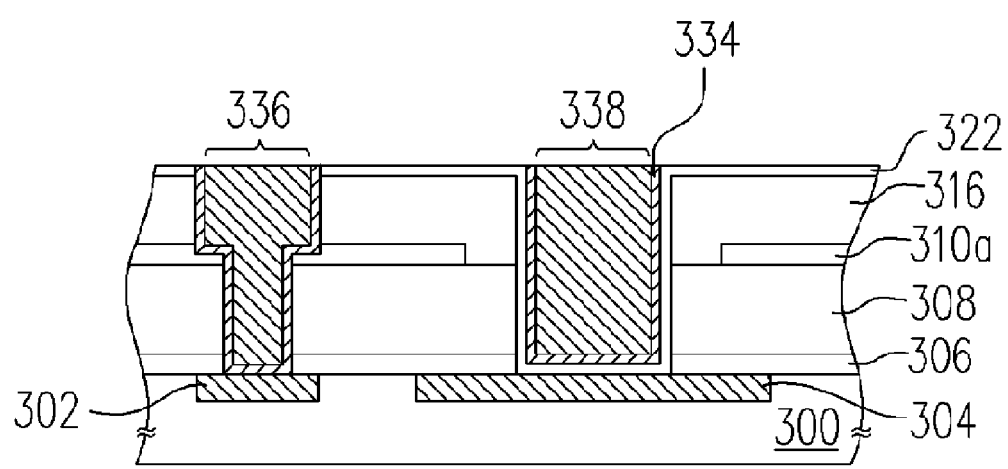

As shown in FIG. 3G, a barrier layer 334 is formed over the substrate 300. The barrier layer 334 is used to prevent the dielectric layer 316 and the dielectric layer 308 from being intruded by diffusing metal atoms. The barrier layer 334 can be made from, for example, tantalum nitride, titanium nitride or titanium silicon nitride. A seed layer (not shown) is formed on the barrier layer 334. A metal layer (not shown) is formed over the substrate 300 to fill out the trench 320 (as shown in FIG. 3F) and the opening 332 (as shown in FIG.

3F). By using the chemical mechanical polishing process, a planarization process is performed until the capacitor dielectric layer 322 is exposed or even is completely removed to form a semiconductor device having a dual metal damascene structure 336 and a MIM capacitor 338.

In the embodiment described above, since the metal deposition process is performed once during the formation of the MIM capacitor and the dual metal damascene structure, the number of the process steps can be decreased so as to reduce the cost of the manufacturing process. Moreover, while the dual damascene opening is formed, the etching stop layer is used as a self-aligned mask layer. Therefore, the dual damascene opening can be formed by performing the etching process only one time. Further, no capacitor dielectric layer is formed in the via hole to lead the problem of minimizing the size of the via hole.

In the embodiment mentioned above, the metal layers 302 and 304 are used to be the contact regions in contact with the dual metal damascene structure and the lower electrode of the capacitor respectively. However, the present invention is not limited to used the metal layer as described in the embodiment. That is, the contact regions can be made of any material with conductive property.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method of manufacturing a semiconductor device for simultaneously forming a wire structure and a capacitor, comprising:
   providing a substrate having a first conductive layer and a second conductive layer formed thereon;
   forming a first dielectric layer over the substrate;
   forming an etching stop layer on the first dielectric layer;
   patterning the etching stop layer to form a first opening located above the first conductive layer and a second opening located above the second conductive layer;
   forming a second dielectric layer over the substrate;
   removing a portion of the second dielectric layer and the first dielectric layer to form a first trench exposing the first conductive layer;
   forming a capacitor dielectric layer over the substrate;
   forming a patterned mask layer on the capacitor dielectric layer, wherein the patterned mask layer possesses a third opening located above the second conductive layer;
   removing a portion of the capacitor dielectric layer, a portion of the second dielectric layer and a portion of the first dielectric layer exposed by the third opening to form a fourth opening exposing the second conductive layer;
   removing the patterned mask layer;
   forming a third conductive layer over the substrate; and
   removing a portion of the third conductive layer, wherein the portion of the third conductive layer is not located in the first trench and the fourth opening.

2. The method of claim 1, wherein before the step of forming the first dielectric layer over the substrate, the method further comprises a step of forming a sealing layer over the substrate.

3. The method of claim 2, wherein the sealing layer can be a silicon nitride layer.

4. The method of claim 1, wherein the step of forming the fourth opening in the first dielectric layer further comprises a step of using the etching stop layer as a self-aligned mask layer.

5. The method of claim 1, wherein the etching stop layer can be a silicon nitride layer.

6. The method of claim 1, wherein the step of removing the portion of the third conductive layer other than those located in the first trench and in the fourth opening can be performed by using chemical mechanical polishing.

7. The method of claim 1, wherein the first dielectric layer and the second dielectric layer can be made of silicon oxide.

8. The method of claim 1, wherein the first conductive layer, the second conductive layer and the third conductive layer can be made of copper or aluminum.

9. The method of claim 1, wherein before the step of forming the third conductive layer over the substrate, the method further comprises a step of forming a barrier layer over the substrate, and the step of removing a portion of the third conductive layer other than those located in the first trench and in the fourth opening further comprises a step of removing a portion of the barrier layer.

10. The method of claim 9, wherein the barrier layer can be made of titanium nitride.

11. The method of claim 1, wherein the patterned mask layer can be made of photoresist material.

12. A method of manufacturing a semiconductor device for simultaneously forming a metal damascene structure and a capacitor, comprising:
   providing a substrate having a first metal layer and a second metal layer formed thereon;
   forming a first dielectric layer over the substrate;
   forming an etching stop layer on the first dielectric layer;
   patterning the etching stop layer to form a first opening located above the first metal layer and a second opening located above the second metal layer;
   forming a second dielectric layer over the substrate;
   removing a portion of the first dielectric layer and the second dielectric layer to form a first trench exposing the first metal layer;
   forming a capacitor dielectric layer over the substrate;
   forming a third opening over the capacitor dielectric layer, wherein the third opening is located over the second metal layer;
   removing a portion of the second dielectric layer exposed by the third opening to form a second trench in the second dielectric layer;
   using the etching stop layer as a self-aligned mask layer to remove a portion of the first dielectric layer to form a fourth opening exposing the second metal layer;
   forming a third metal layer over the substrate; and
   removing a portion of the third metal layer other than those located in the first trench, in the fourth opening and in the second trench.

13. The method of claim 12, wherein before the step of forming the first dielectric layer over the substrate, the method further comprises a step of forming a sealing layer over the substrate.

14. The method of claim 13, wherein the sealing layer can be a silicon nitride layer.

15. The method of claim 12, wherein the etching stop layer can be a silicon nitride layer.

16. The method of claim 12, wherein the step of removing a portion of the third metal layer other than those located in the first trench, in the fourth opening and in the second trench can be performed by using chemical mechanical polishing.

17. The method of claim 12, wherein the first dielectric layer and the second dielectric layer can be made of silicon oxide.

18. The method of claim 12, wherein first metal layer, the second metal layer and the third metal layer can be made of copper or aluminum.

19. The method of claim 12, wherein before the step of forming the third metal layer over the substrate, the method further comprises a step of forming a barrier layer over the substrate, and the step of removing a portion of the third metal layer other than those located in the first trench, in the fourth opening and in the second trench further comprises a step of removing a portion of the barrier layer.

20. The method of claim 19, wherein the barrier layer can be made of titanium nitride.

\* \* \* \* \*